(12) United States Patent
Jaiswal et al.

(10) Patent No.: US 10,783,957 B1
(45) Date of Patent: Sep. 22, 2020

(54) READ AND LOGIC OPERATION METHODS FOR VOLTAGE-DIVIDER BIT-CELL MEMORY DEVICES

(71) Applicant: Arm Limited, Cambridge (GB)

(72) Inventors: Akhilesh Ramlaut Jaiswal, West Lafayette, IN (US); Mudit Bhargava, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/359,758

(22) Filed: Mar. 20, 2019

(51) Int. Cl.
| | | |
|---|---|---|
| G11C 7/00 | (2006.01) | |
| G11C 11/419 | (2006.01) | |
| G11C 16/08 | (2006.01) | |
| G11C 16/12 | (2006.01) | |

(52) U.S. Cl.
CPC ............ G11C 11/419 (2013.01); G11C 16/08 (2013.01); G11C 16/12 (2013.01)

(58) Field of Classification Search
CPC . G11C 13/0069; G11C 13/004; G11C 13/003; G11C 2213/71; G11C 13/025; G11C 2213/79; G11C 2213/72; G11C 13/0004; G11C 13/0097; G11C 2213/19; G11C 13/0007; G11C 2213/35
USPC ..... 365/148, 163, 158, 185.21, 189.07, 151, 365/185.18, 208, 154, 185.03, 185.11, 365/185.23, 185.25
See application file for complete search history.

(56) References Cited

U.S. PATENT DOCUMENTS

| | | |
|---|---|---|
| 5,617,350 A | 4/1997 | Roohparvar |
| 8,830,741 B1 | 9/2014 | Willey et al. |
| 2005/0007830 A1 | 1/2005 | Perner et al. |
| 2008/0106927 A1 | 5/2008 | Celinska et al. |
| 2009/0109726 A1 | 4/2009 | Shepard |
| 2011/0292715 A1 | 12/2011 | Ishihara et al. |
| 2013/0027079 A1 | 1/2013 | Nazarian et al. |
| 2013/0182498 A1 | 7/2013 | Aoki |
| 2015/0348595 A1* | 12/2015 | Baker, Jr. ................ G11C 5/06 365/72 |

FOREIGN PATENT DOCUMENTS

WO    2003-083872 A2    10/2003

OTHER PUBLICATIONS

Jaiswal, et al.; U.S. Appl. No. 16/213,804, filed Dec. 7, 2018.
(Continued)

*Primary Examiner* — Thong Q Le
(74) *Attorney, Agent, or Firm* — Pramudji Law Group PLLC; Ari Pramudji

(57) ABSTRACT

In a particular implementation, a method to perform a read operation on a voltage divider bit-cell having first and second transistors and first and second storage elements is disclosed. The method includes: providing a first voltage to a bit-line coupled to the second transistor of the voltage-divider bit-cell; providing a second voltage to a first word-line and providing an electrical grounding to a second word-line; where the first and second word-lines are coupled to the respective first and second resistive memory devices; and determining at least one of first and second data resistances in the respective first and second storage elements based on an output voltage on the bit-line.

21 Claims, 7 Drawing Sheets

(56) References Cited

OTHER PUBLICATIONS

Kim, et al.; Spin-Hall Effect MRAM Based Cache Memory: A Feasibility Study; 73rd Annual Device Research Conference (DRC); 2015.

Kim, et al.; Scaling Analysis of In-plane and Perpendicular Anisotropy Magnetic Tunnel Junctions Using a Physics-Based Model; 72nd Device Research Conference; 2014.

Noguchi, et al.; D-MRAM Cache: Enhancing Energy Efficiency with 3T-1MTJ DRAM / MRAM Hybrid Memory; 2013 Design, Automation & Test in Europe Conference & Exhibition (Date); 2013.

Jiang, et al.; Constructing Large and Fast Multi-Level Cell STT-MRAM based Cache for Embedded Processors; DAC 2012; 2012.

PCT International Search Report and Written Opinion; PCT/GB2020/050553; dated Jul. 29, 2020.

PCT Partial International Search Report and Written Opinion; PCT/GB2020/050553; dated May 28, 2020.

\* cited by examiner

US 10,783,957 B1

READ AND LOGIC OPERATION METHODS FOR VOLTAGE-DIVIDER BIT-CELL MEMORY DEVICES

I. FIELD

The present disclosure is generally related to read and logic operation methods for voltage-divider bit-cell memory devices.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities.

Random access memory (RAM) is a ubiquitous component of modern digital architectures. RAM can be a stand-alone device or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed. Although non-volatile RAM has advantages, such as an ability to retain its contents without applied power, conventional non-volatile RAM has slower read/write times than volatile RAM. Magneto-resistive Random-Access Memory (MRAM) is a non-volatile memory (NVM) technology having response (read/write) times comparable to volatile memory. In contrast to conventional RAM technologies, which store data as electric charges or current flows, MRAM uses magnetic elements.

Resistance-based NVM memories (such as MRAM, phase change memory (PCM), resistive random-access memory (ReRAM), correlated electron random access memory (CE-RAM)) that store data as a switchable resistance, show promise in meeting currently anticipated data storage needs of personal computing devices, as they may provide high capacity, show increasing access speeds, and have low power consumption. Among the data storage needs, the capacity to perform memory read and write operations, as well as perform various logic operations (e.g., Boolean logic operations) quickly, accurately, and with low power consumption is an ongoing need in the art.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
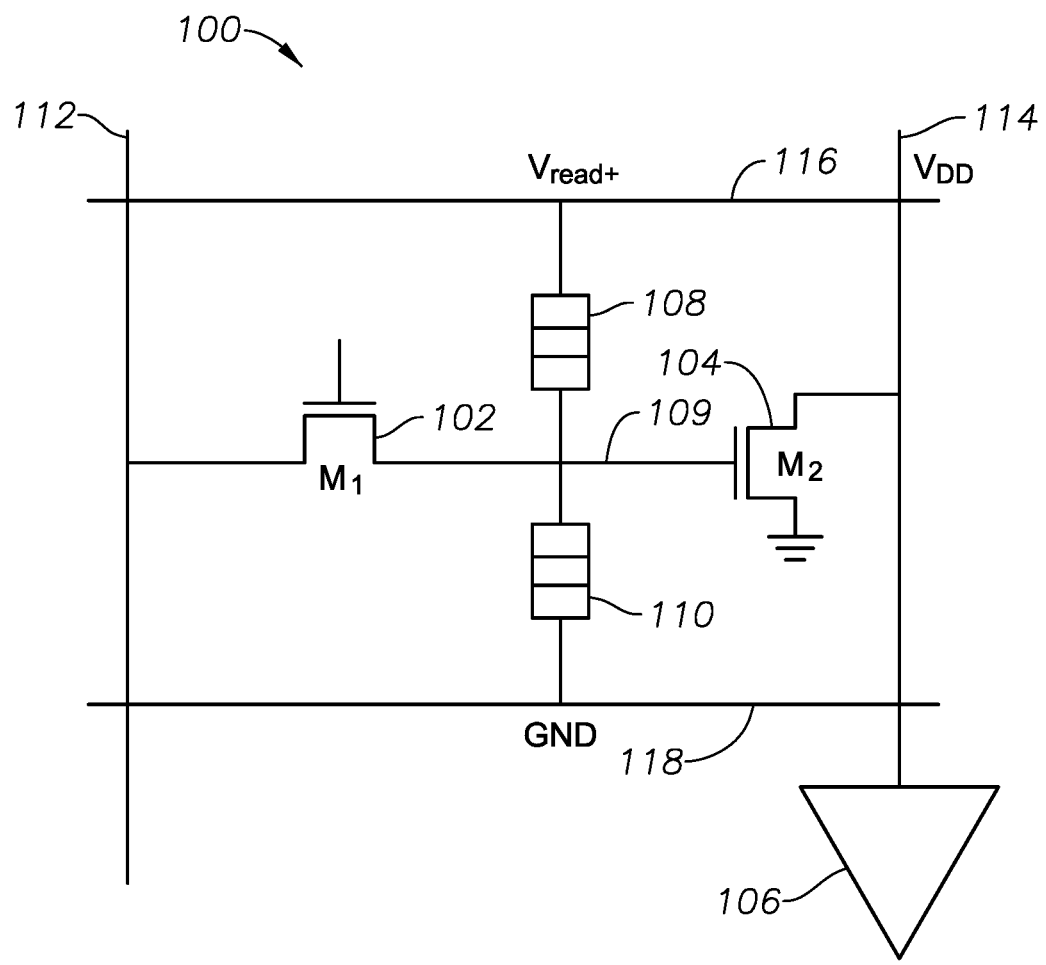
FIG. 1 is a schematic diagram of a voltage-divider bit-cell implementable with example methods for read and/or write operations.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a method to perform a read operation on a voltage divider bit-cell having first and second transistors and first and second storage elements is disclosed. The method includes: providing a first voltage to a bit-line coupled to the second transistor of the voltage-divider bit-cell; providing a second voltage to a first word-line and providing an electrical grounding to a second word-line; where the first and second word-lines are coupled to the respective first and second resistive memory devices; and determining at least one of first and second data resistances in the respective first and second storage elements based on an output voltage on the bit-line.

According to another implementation of the present disclosure, a method to perform logic computations in a memory array is disclosed. The method includes: providing a first voltage to a column bit-line coupled to the plurality of rows of voltage-divider bit-cells; activating two or more rows of the voltage-divider bit-cells, where each of the two or more or rows are activated by: providing a second voltage to a respective first word-line of the one or more rows and providing an electrical grounding to a respective second word-line of the one or more rows, where the respective first and second word-lines are coupled to the respective first and second storage elements of the voltage-divider bit-cells; and determining respective column data values of the two or more activated rows based on an output voltage of the column bit-line, where determining the respective column data values correspond to a logic operation.

According to another implementation of the present disclosure, a method to perform a batch read in a memory array is disclosed. The method includes providing a first voltage to a column bit-line coupled to a plurality of rows of voltage-divider bit-cells; performing a first computation on two or more rows of the voltage-divider bit-cells in a first memory cycle, where the first computation is either a NOR-Boolean computation or a NAND-Boolean computation; and determining if first respective column data values of the two or more activated rows correspond to a first logic operation.

Particular implementations of the present disclosure are described below with reference to the drawings. In the description, common features are designated by common reference numbers throughout the drawings.

Referring to FIG. 1, an example circuit for a voltage-divider bit-cell 100 is shown. As depicted in FIG. 1, the example voltage-divider bit-cell circuit design comprises a voltage-divider bit-cell 100 (i.e., "2T2R" bit-cell 100) including at least first and second MTJ devices (i.e., first and second storage elements, first and second resistive memory devices) 108, 110, at least first and second transistors (M1, M2) (e.g., NMOS transistor devices, write and read transistor devices) 102, 104, first and second bit-lines (e.g., a write bit-line and a read bit-line) 112, 114, first and second word-lines (e.g., top and bottom lines) 116, 118, and a sense amplifier 106 coupled to the read bit-line 114. As shown, an electrical path between the first and second MTJ devices 108, 110 provide for an example voltage-divider circuit design. In certain implementations, the voltage-divider bit-cell 100 may be memory devices such as an MRAM, phase change memory (PCM), resistive random-access memory (ReRAM), correlated electron random access memory (CE-RAM), or other similar types of memory devices.

Prior to performing a read operation or afterwards, data may be written to the voltage-divider bit-cell 100. In one implementation, complementary data (e.g., "0" and "1", two data states) may be stored (i.e., programmed, written) in the first and second MTJ devices 108, 110. In another implementation, a data value may be written to one of the MTJ devices (the MTJ device 108 or 110), while the other MTJ device would be a reference memory element (i.e., a reference memory) having fixed resistance (i.e., constant resistance that does not store a data value).

With reference to FIG. 1, for both above-mentioned implementations (e.g., complementary data values or reference element and data value), in one example, a first voltage (e.g., an operating voltage of the circuit, VDD, the supply voltage) may be provided to a write bit-line 112, while electrical grounding (within approximately +/−5%) is applied to the first and second word-lines 116 and 118. In doing so, current would flow "inward" from the write bit-line 112 through the first transistor 102, and through the first and second MTJ devices 108, 110. As the current would flow "upwards" through the first MTJ device 108, a single bit value corresponding to a digital "1" is written in the first MTJ device 108, and as the current flows "downwards" through the second MTJ device 110, a single bit value corresponding to a digital "0" is written in the second MTJ device.

Also, with reference to FIG. 1, for both above-mentioned implementations (e.g., complementary data values or reference element and data value), in another example, in contrast, a first voltage (e.g., an operating voltage of the circuit, VDD, the supply voltage) may be provided to the first and second word-lines 116 and 118, while electrical grounding (within approximately +/−5%) can be applied to the write bit-line 112. In doing so, current would flow "outward" from the first and second MTJ devices 108, 110 through the first transistor 102, and to the write bit-line 112. As the current would flow "downwards" through the first MTJ device 108, a single bit value corresponding to a digital "0" is written in the first MTJ device 108, and as the current would flow "upwards" through the second MTJ device 110, a single bit value corresponding to a digital "1" is written in the second MTJ device.

Figure 2:
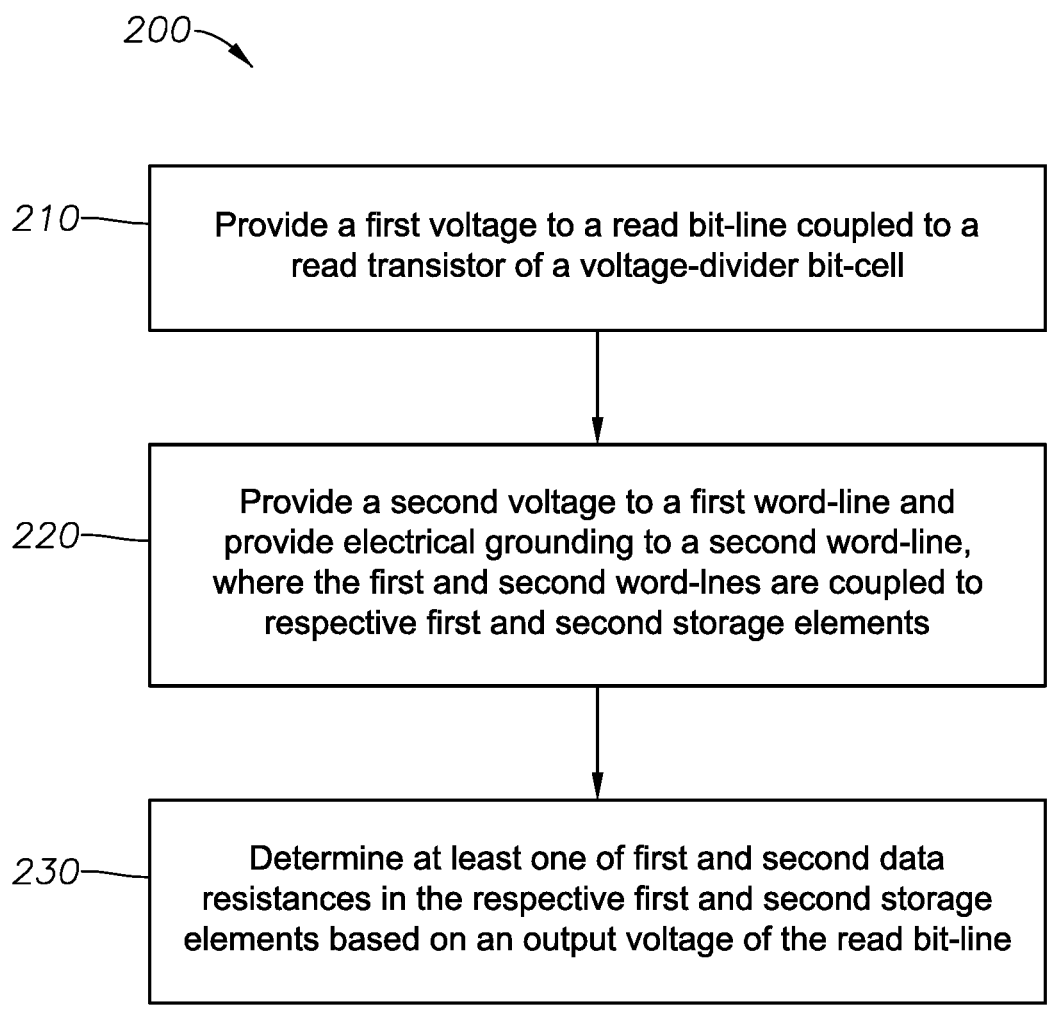
FIG. 2 is a flowchart of a particular illustrative aspect of methods of reading a voltage-divider bit-cell.

Referring to FIG. 2, a method flowchart for a particular read operation 200 applicable for the above-mentioned example voltage-divider bit-cell 100 is shown. The operation 200 may be performed in any of the circuit designs described herein including circuits 100, 300, 400, and 600 as described with reference to FIGS. 1, 3, 4, and 6.

As an example implementation with reference to FIGS. 1 and 2, in conducting a read operation (e.g., a sequential read operation) of the voltage-divider bit-cell 100, initially, at block 210 (as shown in FIG. 2), a first voltage may be provided to pre-charge a read bit-line 114. In a certain example, the first voltage may be an operating voltage of the circuit (e.g., VDD, the supply voltage). At block 220 (as shown in FIG. 2), a second voltage (e.g., Vread+, an arbitrary voltage value, within approximately +/−5%, that is either "small enough" such that its voltage is insufficient for write operations or "fast enough" to avoid unintentional switching) can be provided across the path coupling the first and second MTJ devices 108, 110. In one such example, the voltage divider bit-cell 100 may include a voltage ratio of "2", for example, such that an electrical resistance of the second MTJ device 110 is twice as much as the first MTJ device 108. Other implementations may include different voltage ratios. In a first case, if the second voltage applied to the first word line 116 (i.e., the top line 116 that is coupled to the first MTJ device 108) is 900 mV (as an example voltage) and if electrical grounding (within approximately +/−5%) is applied to the second word line 118 (i.e., the bottom line 118 that is coupled to the second MTJ device 110), an electrical path is generated and the voltage across the first and second MTJ devices 108, 110 would be 300 mV and 600 mV, respectively, computed through a voltage division calculation. As such, in a particular cycle, for the first MTJ device 108, it would now be determined that as an electrical resistance (i.e., a first data resistance, a first data value), a digital "0" (e.g., a low value) in a resistance-off ("$R_{OFF}$") state was stored, while in the second MTJ device 110, it would now be determined that as an electrical resistance (i.e., a second data resistance, a second data value), a digital "1" (e.g., a high value) in a resistance-on ("$R_{ON}$") state was stored. Hence, the first and second MTJ devices store the digital complement of the other. Accordingly, a voltage 109 at a node between the first and second MTJ devices 108, 110, that is applied to the second transistor (M2) 104 (i.e., an input voltage 109 of the second transistor (M2)) would correspond to a digital "1". Alternatively, in a second case, if the voltage applied to the bottom line 118 of the voltage bit-cell 100 (e.g., Vread+ within approximately +/−5%) is 900 mV (as an example voltage) and if electrical grounding (within approximately +/−5%) is applied to the top line 116, an electrical path is generated and the voltage across the first and second MTJs 308, 310 would be 600 mV and 300 mV, respectively, computed through a voltage division calculation. As such, for the first MTJ device 108, it would now be determined that as an electrical resistance (i.e., a first data resistance, a first data value), a digital "1" (e.g., a high value) in a resistance-on ("$R_{ON}$") state was stored, and for the second MTJ device 110, as an electrical resistance (i.e., a second data resistance, a second data value), a digital "0" (e.g., a low value) in a resistance-on ("$R_{ON}$") state was stored. In contrast to the first case, in the second case, the input voltage 109 between the first and second MTJ's 108, 110 that is applied to the second transistor (M2) 104 (i.e., the input voltage of the second transistor (M2)) would now correspond to a digital "0" value.

In the first case when the input voltage 109 corresponds to a digital "1", the input voltage 109 is amplified through the second transistor (M2) 104 to generate a differential current on the read bit-line 114. Accordingly, the input voltage 109 is "high enough" to turn the second transistor (M2) 104 "on" (i.e., the input voltage 109 exceeds a particular discharge threshold voltage of the second transistor (M2). In certain examples, when the second transistor 104 is "on", the voltage (the first voltage (e.g., VDD)) on the read bit-line 114 would start discharging through the second transistor 104 (i.e., the read bit-line 114 incurring a different rate of voltage drop). Also, this discharging of voltage may be sensed (i.e., determined) at the sense amplifier 106 (or an inverter for inverter-based sensing), by the output of the sense amplifier 106, for example, as a digital "1" value.

In contrast, in the second case, if the stored electrical resistances (i.e., data values, data resistances) of the first and second MTJ devices were a digital "1" (e.g., high) and digital "0" (e.g., low), respectively, the input voltage 109 corresponds to a digital "0" and the second transistor 104 is "off". Hence, there is no discharging path or very minimal voltage discharge to the second transistor (M2) 104. In this case, the input voltage 109 is not sufficient to turn the second transistor (M2) 104 "on" (i.e., the input voltage 109 does not exceeds a particular "high enough" discharge threshold voltage of the second transistor (M2)). Accordingly, the voltage on the read-bit line 114 would remain at the first voltage (i.e., the pre-charged level (e.g., VDD)), and no differential current would be generated on the read bit-line 114. Thus, no different voltage drop rate would be incurred on the read bit-line 114. As such, for the second case, the output of the sense amplifier 106 (or an inverter for inverter-based sensing) would sense (i.e., determine) the read-bit line, for example, as a digital "0" value.

Therefore, at block 230 (as shown in FIG. 2), based on an output of the sense amplifier 106 (or inverter for inverter-based sensing), whether it may be a digital "1" value or a digital "0" value, the electrical resistances of the first and second MTJ devices 108, 100 may be determined. In certain MRAM implementations, upon determining the electrical resistance of the first and second MTJ devices 108, 110, the second voltage (e.g., Vread+) can be removed from the MRAM voltage-divider bit-cell 100 prior to the end of an incubation delay interval. This would be performed in implementations where due to the duration of the second voltage, an undesired write may occur.

In another example implementation with reference to FIGS. 1 and 2, instead of complementary data values (e.g., "0" and "1" values) that had been stored in the first and second MTJ devices (i.e., first and second storage elements, first and second resistive memory devices) 108, 110, one MTJ device would be a reference memory element (i.e., a reference memory) having a fixed resistance (i.e., a constant resistance that does not store a data value), while the other MTJ device would have an actual data element (i.e., a programmable data value). In this example, a voltage-divider can be formed between the reference memory element and the actual data element when the resistance-on resistance-off ratio ($R_{ON}/R_{OFF}$) is "high enough" (i.e., exceeding a certain threshold level). Other than this, the remaining operation would be the same as the previous example implementation.

Advantageously in the example voltage-divider bit-cell 100, by using a greater read voltage (e.g., Vread+), a faster and more reliable read sensing may be realized. For example, the sensing operation is a direct function of the discharge current through the second transistor (M2) 104. The discharge current is a function of the input voltage at 109, which in turn is a direct function of Vread+(=Rup−Rdw/Rup+Rdw Vread+), where Rup and Rdw are resistances of the MTJs 108 and 110, respectively. Therefore, in general, a greater Vread+ would generate a greater discharge current that may result in a more reliable read sense operation at the sense amplifier 106.

Moreover, by using a higher voltage, circuit configurations are generally more robust, reliable, and allow for faster read times. For example, a higher (i.e., a greater) voltage for a read operation would result in higher read currents that may be sensed faster. Furthermore, by using higher read voltages, design challenges that are present in low voltage operation may be avoided. For example, at higher read voltages, a designer now has the capability to not have to implement another intermediate voltage level (e.g., a dedicated read voltage, low Vread). Thus, by not having to use a dedicated read voltage, advantageously, the same or substantially similar voltage levels may be used for both read and write operations. Hence, less complexity in circuit operation may be realized.

Nevertheless, in some cases, the use of high voltages during read operations may have certain disadvantages. For example, the use of a higher read voltage may reduce the effective read $R_{ON}/R_{OFF}$ ratio, thereby affecting sense-margin. Also, the use of a higher read voltage may further result in reduced device endurance (i.e., device lifespan). As such, considering the trade-offs between the advantages and disadvantages of using a higher read voltage may result in a choice of an intermediate read voltage level (e.g., 0.6-0.8V) that is greater than the typical read voltages (e.g., 0.3-0.4V) but still significantly below the regular supply voltage (e.g., approximately 1V) or voltages used in write operations or for use in other circuit bit-cells (e.g., approximately 1.5V).

Figure 3:
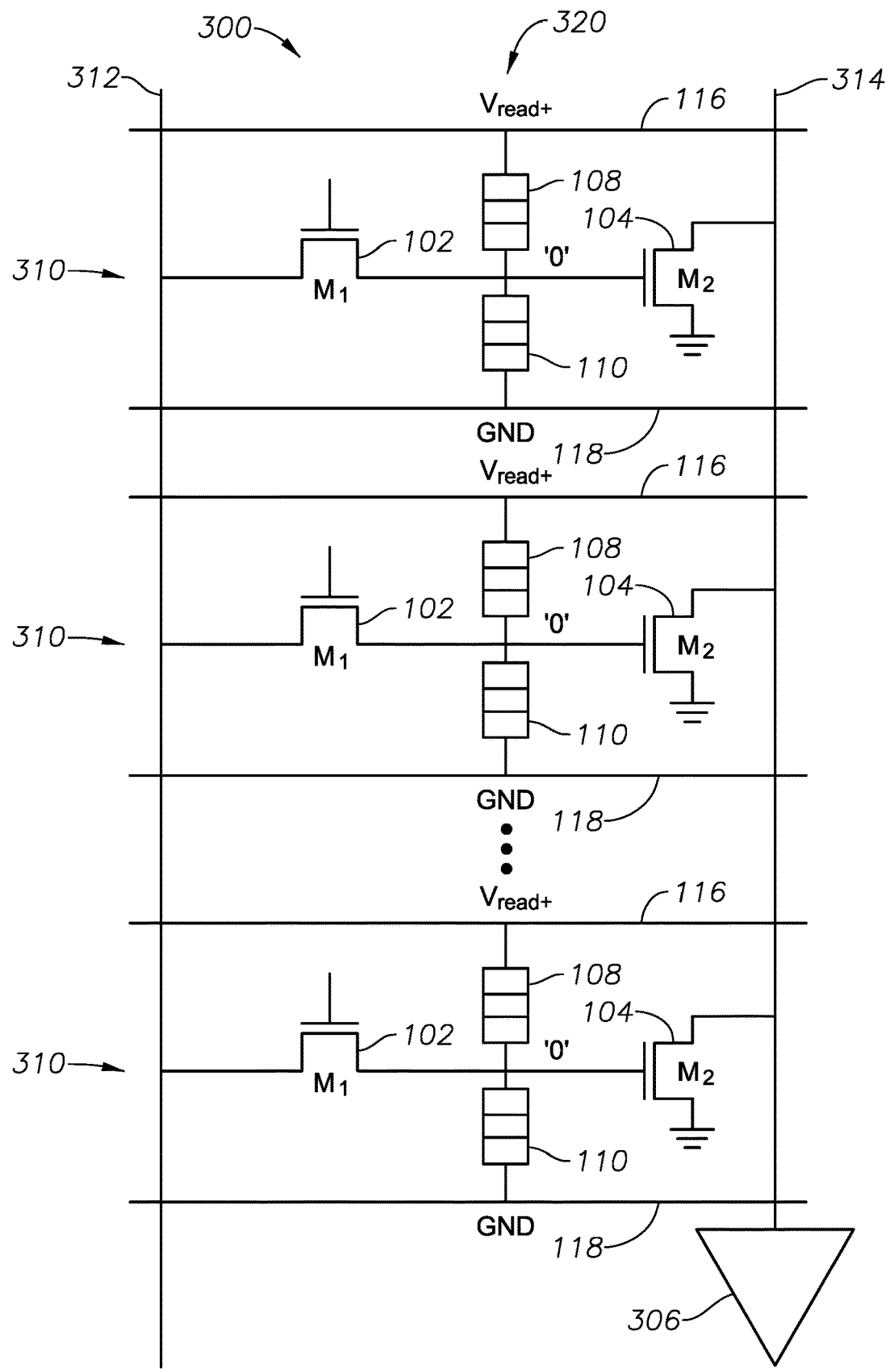
FIG. 3 is a schematic diagram of a memory array including voltage-divider bit-cells implementable with example methods for performing Boolean logic computations.
Figure 4:
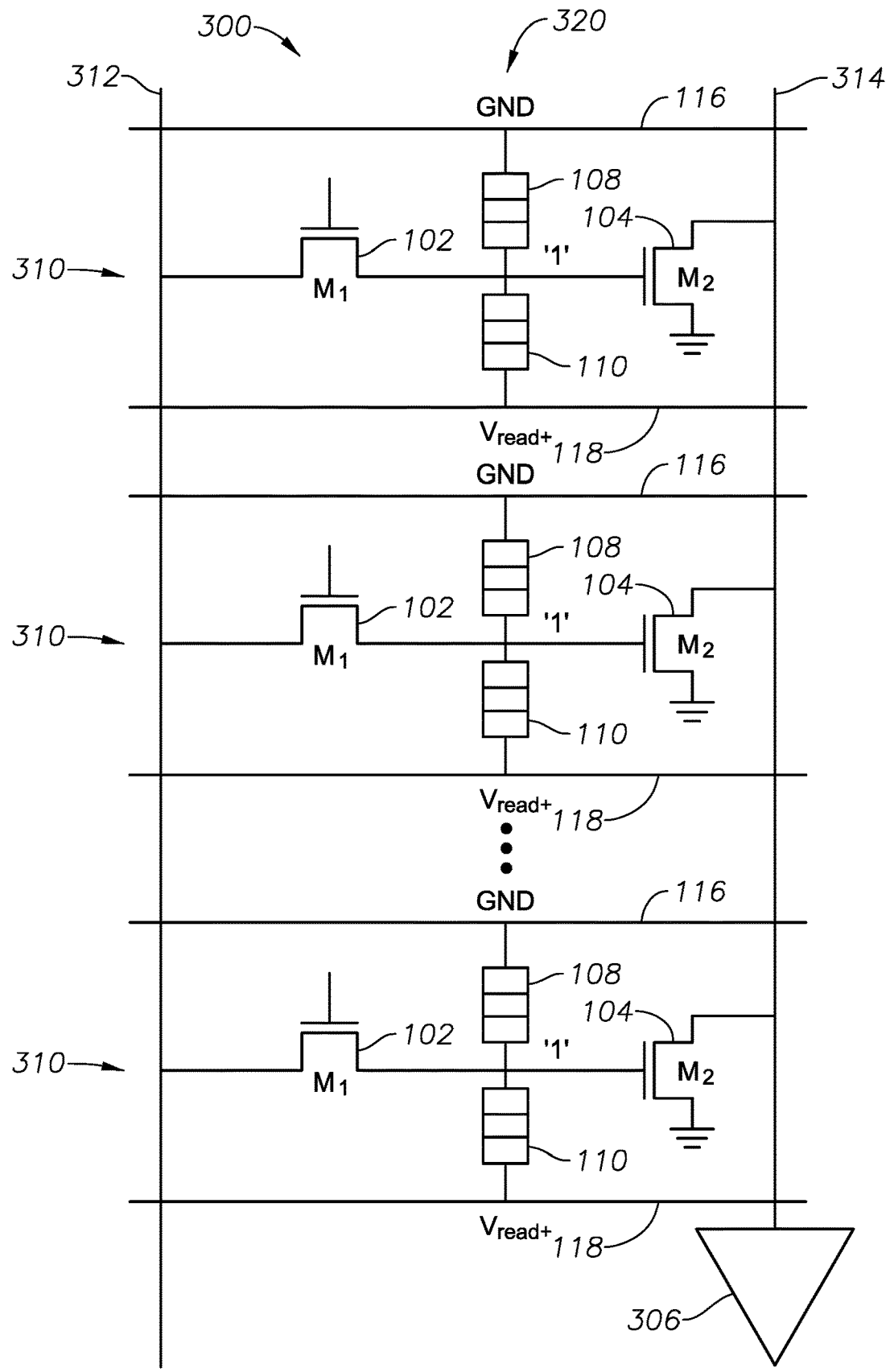
FIG. 4 is a schematic diagram of a memory array including voltage-divider bit-cells implementable with example methods for performing Boolean logic computations.

Expanding on the proposed read operation as discussed with reference to FIGS. 1 and 2, Boolean logic computations may also be performed. Referring to FIGS. 3 and 4, a memory array 300 having a plurality of rows 310 and at least one column 320 of voltage-divider bit-cells 100 is shown. FIG. 3 illustrates a circuit for the example memory array 300 used for a NOR-Boolean computation, while FIG. 4 illustrates a circuit for the example memory array 300 used for a NAND-Boolean computation. As illustrated in FIGS. 3 and 4, each of the example voltage-divider bit-cells 100 (i.e., "2T2R" bit-cell 100) include at least first and second MTJ devices (i.e., first and second storage elements, first and second memory devices) 108, 110, at least first and second transistors (M1, M2) (e.g., NMOS transistor devices, write and read transistor devices) 102, 104, and first and second word-lines (e.g., top and bottom lines) 116, 118. Also, in the memory array 300, each the voltage-divider bit-cells 100 are separately coupled to a read bit-line 314 (i.e., column bit-line), and the read bit-line 314 is in turn coupled to a sense amplifier 306 (or an inverter for inverter-based sensing). In certain implementations, the memory array 300 can include voltage-divider bit-cells 100 that are memory devices such as an MRAM, phase change memory (PCM), resistive random-access memory (ReRAM), random-access memory (CE-RAM), or other similar types of memory devices.

Figure 5:
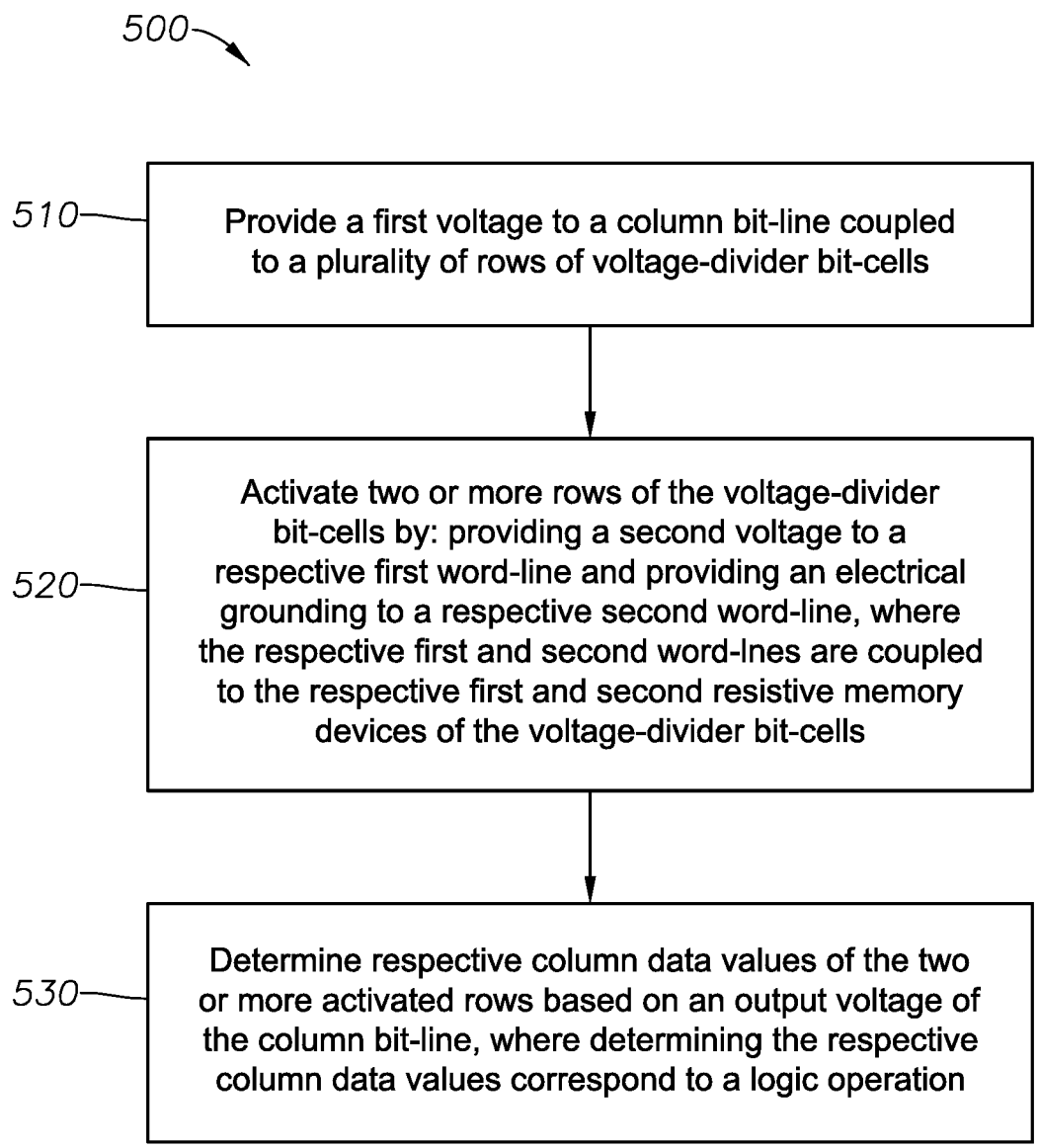
FIG. 5 is a flowchart of a particular illustrative aspect of methods of performing Boolean logic computations.

Referring to FIG. 5, a flowchart 500 for Boolean computations applicable for the example memory array 300 is shown. The Boolean computations may be performed in the circuit designs 300 and 400 as described with reference to FIGS. 3 and 4.

With reference to FIGS. 3-5, in performing Boolean computations on the example memory array 300, initially, at block 510 (as illustrated in FIG. 5), a first voltage may be provided to pre-charge the read bit-line 314. In a certain example, the first voltage may be an operating voltage of the circuit (e.g., VDD, the supply voltage). Next, at block 520, at least two of the voltage-divider bit-cells 100 are activated (i.e., selected): by providing a second voltage (e.g., Vread+, an arbitrary voltage value within approximately +/−5%) to the respective at least two first word-lines (e.g., either word line 116 or 118 depending on whether a n-bit NOR or n-bit NAND computation is being performed) (of the one or more activated rows 310 of the memory array 300), and by providing an electrical grounding (within approximately +/−5%) to the respective at least two second word-lines (e.g., either word line 116 or 118 depending on whether a n-bit NOR or n-bit NAND computation is being performed) (of the two or more activated rows 310 of the memory array 300). Similar to as described with reference to FIG. 1, the respective at least two first and second word-lines 116, 118 are coupled to respective first and second resistive memory devices 108, 110 of the at least two activated voltage divider bit-cells 100. Upon activating the two or more rows 310, at block 530, respective column data values of the two more activated rows 310 may be determined, at the sense amplifier 306 (or an inverter for inverter-based sensing), based on an output voltage of the column bit-line 314.

With reference to FIG. 3, in one implementation of performing an n-bit NOR computation in the memory array 300, one column and multiple rows of voltage-divider bit-cells 310 can be utilized. For example, two or more rows (e.g., an arbitrary number of rows) can be activated at the same time. To do so, the second voltage (e.g., Vread+ within approximately +/−5%) can be applied to the respective at least two or more word-lines 116 and electrical grounding (within approximately +/−5%) can be applied to the respective at least two second word-lines 118 of the two or more rows 310 (e.g., the arbitrary number of rows) of the memory array 300 to be activated. In each of the activated rows, it may be assumed that the first and second data values stored in the first and second resistive memory devices 108, 110 are a "0" digital value (corresponding to a "high" value) and a "1" digital value (corresponding to a "low" value), respectively. Hence, in each of the activated bit-cells, the input voltage 109 (i.e., input voltage) would be "low enough" (i.e., having a digital "0" value) such that the corresponding second transistors (M2) 104 are "off". As a result, the column bit-line 314 would remain at the first voltage (e.g., VDD, the supply voltage) as sensed by the sense amplifier 306. Thus, the column bit-line 314 would remain at the first voltage so long as each of the corresponding transistors (M2) 104 are "off" (corresponding to a digital "0"). Consequently, this circuit design matches with the same truth table as that of a NOR gate operation. That is, the sensed output (e.g., by the sense amplifier 306) corresponds to a digital "1" (e.g., VDD) when all the inputs correspond to a digital "0".

With reference to FIG. 4, in one implementation of performing an n-bit AND computation (i.e., an n-bit NAND computation where the output can be inverted) in the memory array 300, one column and multiple rows of voltage-divider bit-cells 310 can be utilized. For example, two or more rows (e.g., an arbitrary number of rows) can be activated at the same time. To do so, in contrast to a n-bit NOR operation, the second voltage (e.g., Vread+ within approximately +/−5%) can be applied to the respective at least two second word-lines 118 and electrical grounding (within approximately +/−5%) can be applied to the respective at least two first word-lines 116 of the one or more rows 310 (e.g., the arbitrary number of rows) of the memory array 300 to be activated. In each of the activated rows, it may be presumed that the first and second data values in the first and second resistive memory devices 108, 110 are a "1" digital value (corresponding to a "low" value) and a "0" digital value (corresponding to a "high" value), respectively. Hence, in each of the activated rows of bit-cells, the input voltage 109 (i.e., intermediary voltage, input voltage) would be "high enough" (i.e., having a digital "1" value) such that the corresponding second transistors (M2) 104 are "on". However, since the second voltage (e.g., Vread+) is applied to the second word-lines 118, the computation looks similar to the NOR computation in FIG. 3. Thus, even though the input voltages 109 are digital "1" values, they each start to look like digital "0" values, because the second voltage was inverted (applied to the second word-lines 118). It is noted, however, that the data values in the first and second resistive memory devices are not "flipping", but rather just that the input voltages 109 have been temporarily inverted. Consequently, even though all of the input voltages 109 of the activated rows 310 are a digital "1", the corresponding second transistors (M2) remain "off", and the voltage sensed on the column bit-line 314 remains the first voltage (e.g., VDD, the supply voltage) (as no discharge path is available) and corresponds to a digital "1". Hence, the computation corresponds to the same truth table as that of an AND operation, where the output is "1", when all the inputs are "1". From this, subsequently, at the sense amplifier 306, the resultant output can be inverted to provide a NAND logic operation. That is, the sensed output corresponds to a digital "0" value when all the inputs correspond to a digital "1" value.

Advantageously, the inventive methods allow for faster and more reliable read sensing for in-memory bit-wise Boolean computing. Moreover, such n-bit logic computations as described in above paragraphs can be performed with any NVM voltage-divider bit cells as described herein. In fact, with PCM and ReRAM, the number of rows that can be activated at the same time can be much greater. In PCM and ReRAM voltage-divider bit-cells, the resistance difference between of the first and second MTJs 108, 110 is "higher" such that the input voltage 109 is going to be much greater. As a result, the second transistor (M2) would be "strongly" "on" or "off", providing greater accuracy in a larger capacity of rows for logic computations.

Expanding on these methods of Boolean computations, the methods for memory storage can be performed for particular types of data. As one example, the methods can be used for data where there is inherent locality (i.e., video/graphics background (e.g., all the same color)). If there is "strong locality", an inference can be made that there is a strong likelihood that all the data values stored in a particular batch (e.g., n-pixels of a raw image) are the same, while data values can change at the boundaries (e.g., boundaries of the colors, textures, etc.). Hence, if the data values stored are the same, instead of performing a read operation one row at a time, batch read for several rows (e.g., 3, rows, 16 rows, 32 rows, etc.) can be performed through Boolean NOR and NAND computations. By doing so, memory read operations can be performed efficiently and with less power consumption. For example, instead of sequentially activating 64 rows, 64 times, activation can occur once, a read operation can occur once, and the process may be completed. Hence, significant energy and speed performance benefits can be realized.

Figure 6:
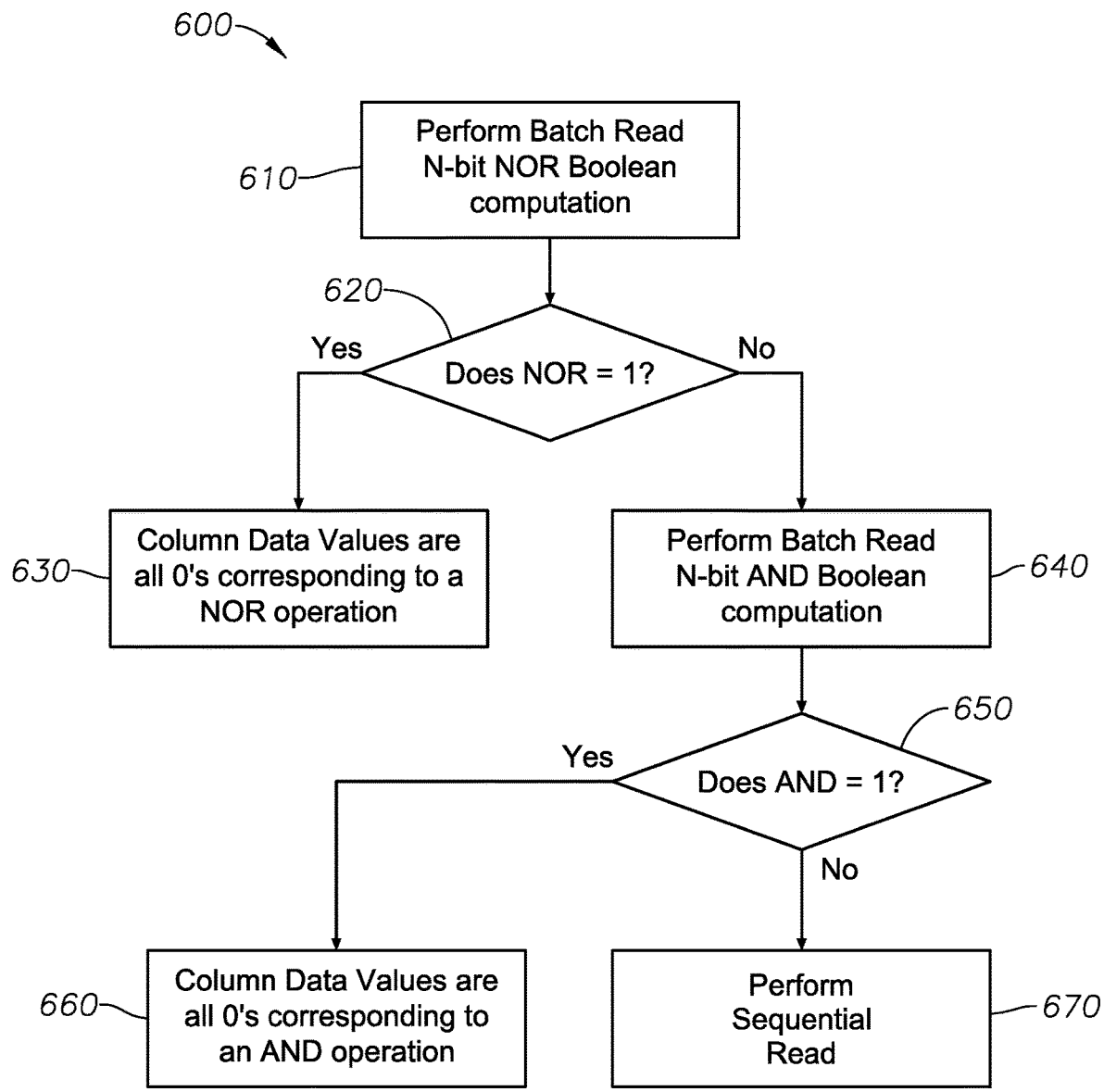
FIG. 6 is a flowchart of a particular illustrative aspect of methods performing batch-read of a memory array.

Referring to FIG. 6, an operational flowchart 600 to perform batch read Boolean NOR and NAND computations applicable for the example memory array 300 in FIGS. 3 and 4 are shown. In certain implementations, the batch read (i.e., performing read operation for two or more or several rows) computations can be performed on voltage-divider bit-cells 100 for memory devices such as an MRAM, phase change memory (PCM), resistive random-access memory (ReRAM), correlated electron random-access memory (CE-RAM), or other similar types of memory devices. Moreover, such Boolean computations may also be performed in complementary metal oxide semiconductor (CMOS) differential bit-cells.

In one implementation, to begin, at block 610, in a first memory cycle, a batch read n-bit NOR Boolean computation can be performed on the memory array 300. This computation can be performed similarly to the n-bit NOR Boolean computation as discussed in detail with reference to FIG. 3 above. Initially, a first voltage (e.g., $V_{DD}$) is provided to a column bit-line 314 (i.e., a read bit-line) that is coupled to the plurality of rows of voltage-divider bit-cells. Next, two or more rows 310 (or several) (e.g., a batch) of the voltage-divider bit-cells 100 may be simultaneously activated by: 1) providing a second voltage (e.g., Vread+ within approximately +/−5%) to respective top word-lines 116 of the two or more rows 310, and 2) providing an electrical grounding (within approximately +/−5%) to respective bottom word-lines 118 of the two or more rows 310. Also, the respective first and second word-lines are coupled to the respective first and second resistive memory devices 108, 110 (i.e., first and second storage elements) of the voltage-divider bit-cells 310. After activation of the two or more rows 310, respective column data values of the two or more rows 310 may be determined based on an output voltage of the first bit-line 314.

At block 620, a determination can be made whether the output voltage of the first bit-line 314 is a digital "1" value (i.e., the n-bit NOR Boolean computation equals a digital "1" (NOR=1?). If "yes", at block 630, the respective column data values (i.e., given column) (of the two or more activated rows 310) all store a digital "0" values corresponding to a NOR operation. Accordingly, the resultant sensed output is a digital "1", if each of the inputs is a digital "0". Hence, by activating n-word lines (for example, 3, 16, 32 word-lines), and sensing a digital "1" at the output of the circuit, a NOR operation is realized.

If the result of the determination at block 620 is "no" (i.e., inconclusive), at block 640, in a second memory cycle, a batch read n-bit NAND Boolean computation can be performed on the memory array 300. This computation can be performed similarly to the n-bit NAND Boolean computation as discussed in detail with reference to FIG. 4 above. Initially, a first voltage (e.g., $V_{DD}$) is provided to a column bit-line 314 (i.e., a read bit-line) that is coupled to the plurality of rows of voltage-divider bit-cells. Next, two or more rows 310 (or several) (e.g., a batch) of the voltage-divider bit-cells 100 may be simultaneously activated by: first, providing a second voltage (e.g., Vread+ within approximately +/−5%) to respective bottom word-lines 118 of the two or more rows 310, and second, providing an electrical grounding (within approximately +/−5%) to respective top word-lines 116 of the two or more rows 310. Also, the respective first and second word-lines are coupled to the respective first and second storage elements 108, 110 (i.e., first and second resistive memory devices) of the voltage-divider bit-cells 310. After activation of the two or more rows 310, respective column data values of the two or more rows 310 may be determined based on an output voltage of the first bit-line 314.

At block 650, a determination can be made whether the output voltage of the first bit-line 314 is a digital "1" value (i.e., the n-bit AND Boolean computation equals a digital "1" (AND=1?). If "yes", at block 660, the respective column data values (i.e., given column) (of the two or more activated rows 310) all store digital "1" values corresponding to an AND operation, and by inverting the resulting output, the computation matches the truth table of a NAND logic operation. That is, the sensed output (e.g., by the sense amplifier 306) corresponds to a digital "0", when each of the inputs (e.g., the respective column data values of the two or more activated rows 310) are a digital "1".

If the result of the determination at block 650 is "no" (i.e., inconclusive (e.g., the column bit line 314 discharges for both NOR as well as AND operations)), at block 670, in a third memory cycle, a sequential read operation (i.e., activating one particular row at a time, and subsequently reading the stored data in order) may be performed if desired. In certain implementations, the sequential read operation may be the same or similar to the example methods of read operation as described with reference to FIGS. 1 and 2 above.

In another implementation, the order in which the batch read n-bit NOR Boolean computation and n-bit NAND Boolean computation may be reversed. Hence, at block 610, instead of performing a batch read n-bit NOR Boolean computation, a batch read n-bit NAND Boolean computation can be performed. Also, at block 640, instead of performing a batch read n-bit NAND Boolean computation, a batch read n-bit NOR Boolean computation can be performed. In such an implementation, the other blocks in the sequence of operation may be the same.

Advantageously, the example methods allow for batch read of multiple rows to be read in one cycle provided that data in the activated rows are the same (i.e., data having "strong locality"). Such example methods would be useful for reading data in memory in video, graphics, machine learning, etc. that have strong locality. Moreover, in case a mismatch does occur, the example methods allow for ease in determining which specific bit do not match. For example, as other match operations may be performed for each column of a memory array, a circuit designer would know whether the least significant bits (LSBs) or the most significant bits (MSBs) mismatch. As such, for approximate read operations, if MSBs match and LSBs do not match, a designer may still take the data from a particular batch read operation without having to fall back to a sequential read operation. Hence, approximate computing with negligible degradation in accuracy may still be accomplished through the example methods.

Figure 7:
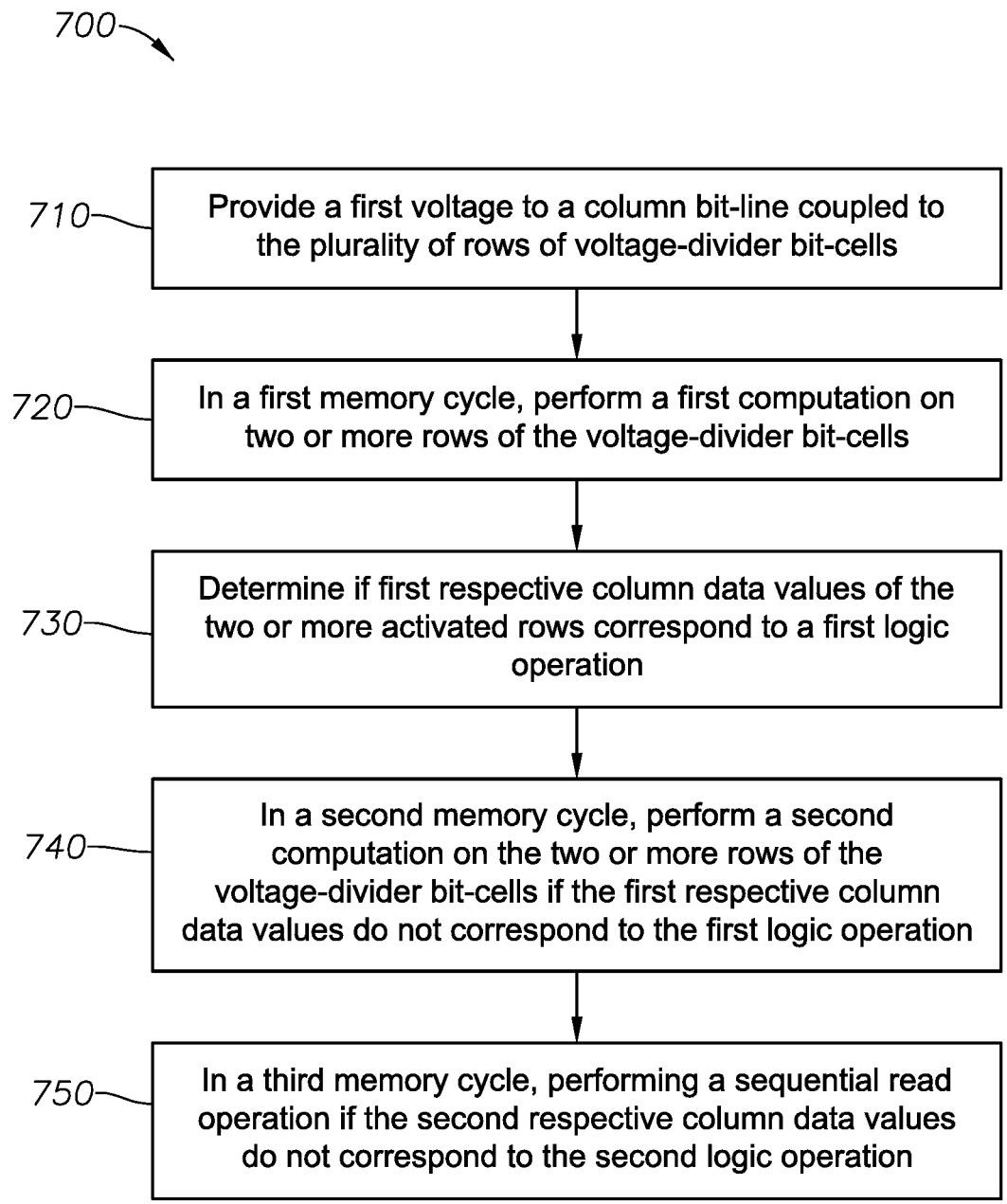
FIG. 7 is a flowchart of a particular illustrative aspect of methods of performing batch-read of a memory array.

Referring to FIG. 7, a method flowchart for particular batch read operations 700 (corresponding to the operational flowchart 600) applicable for the example memory array 300 is shown. The batch operations 700 may be performed by memory having similar voltage-divider circuit designs for MRAM, PCM, ReRAM, CE-RAM, or other similar types of resistive memory devices. Moreover, such batch read operations may also be performed in CMOS differential bit-cells.

At block 710, the operations include providing a first voltage to a column bit-line coupled to the plurality of rows of voltage-divider bit-cells.

At block 720, the operations include performing, in a first memory cycle, a first computation on two or more rows of the voltage-divider bit-cells, where the first computation is either a NOR-Boolean computation or a NAND-Boolean computation.

At block 730, the operations include determining whether first respective column data values of the two or more activated rows correspond to a first logic operation, where the first logic operation is a NOR operation when the first computation is the NOR-Boolean computation, and where the first logic operation is a NAND operation when the first computation is the NAND-Boolean computation.

At block 740, the operations include, performing, in a second memory cycle, a second computation on the two or more rows of the voltage-divider bit-cells if the first respective column data values do not correspond the first logic operation, where the first and second computations are different Boolean computations. Also, at block 740, the operations include, determining if second respective column data values of second two or more activated rows correspond to a second logic operation, where the second computation is the NAND-Boolean computation when the first computation is the NOR-Boolean computation, and wherein the second computation is the NOR-Boolean computation when the first computation is the NAND-Boolean computation, and wherein the second logic operation is the NAND operation when the second computation is the NAND-Boolean computation, and the second logic operation is the NOR operation when the second computation is the NOR-Boolean computation.

At block 750, the operations include, performing, in a third memory cycle, a sequential read operation if the second respective column data values do not correspond to the second logic operation. The sequential read operation can include: providing a first voltage to the column bit-line coupled to the second transistor of the voltage-divider bit-cell, providing a second voltage to a first word-line and providing an electrical grounding (within approximately +/−5%) to a second word-line, where the first and second word-lines are coupled to the respective first and second storage memory elements, determining at least one of first and second data resistances in the respective first and second storage elements based on an output voltage of the column bit-line, and determining the output voltage of the t bit-line.

In example implementations, certain circuit elements have been provided in FIGS. 1, 3, and 4, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-7 may illustrate systems, apparatuses, or methods according to the teachings of the disclosure, the disclosure is not limited to these illustrated systems, apparatuses, or methods. One or more functions or components of any of FIGS. 1-7 as illustrated or described herein may be combined with one or more other portions of another of FIGS. 1-7. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A method of read operation in a voltage-divider bit-cell having first and second transistors and first and second storage elements, the method comprising:
   providing a first voltage to a bit-line coupled to the second transistor of the voltage-divider bit-cell;
   providing a second voltage to a first word-line;
   providing an electrical grounding to a second word-line, wherein the first and second word-lines are coupled to the respective first and second storage elements; and
   determining at least one of first and second data resistances in the respective first and second storage elements based on an output voltage on the bit-line.

2. The method of claim 1, further comprising:
   determining, by a sense amplifier, the output voltage on the bit-line.

3. The method of claim 1, further comprising:
   generating an electrical path across the first and second storage elements based on the provided second voltage to the first word-line and the provided electrical grounding to the second word-line.

4. The method of claim 1, wherein the output voltage is determined by:
  determining an input voltage of the second transistor based on the first and second data resistances, wherein the second transistor is configured to provide a discharge path for the first voltage and is coupled to the bit-line.

5. The method of claim 4, wherein the output voltage is further determined by:
  determining if the input voltage of the second transistor exceeds a threshold voltage of the second transistor.

6. The method of claim 5, wherein the output voltage is further determined by:
  discharging the first voltage from the bit-line to the resistive voltage-divider bit-cell if the input voltage exceeds a discharge threshold voltage.

7. The method of claim 1, wherein the first and second data resistances comprise complementary first and second data values or a fixed resistance and a corresponding programmable data value.

8. A method of performing logic computations in a memory array comprising:
  providing a first voltage to a column bit-line coupled to a plurality of rows of voltage-divider bit-cells of the memory array;
  activating two or more rows of the voltage-divider bit-cells, wherein each of the two or more or rows is activated by:
    providing a second voltage to respective first word-lines of the two or more rows;
    providing an electrical grounding to respective second word-lines of the two or more rows, wherein the respective first and second word-lines are coupled to the respective first and second resistive memory devices of the voltage-divider bit-cells; and
  determining respective column data values of the one or more activated rows based on an output voltage of the column bit-line, wherein determining the respective column data values correspond to a logic operation.

9. The method of claim 8, wherein determining the respective column data values includes determining, by a sense amplifier, the output voltage of the first bit-line.

10. The method of claim 9, wherein the first word-lines are top-lines and the second word-lines are bottom-lines.

11. The method of claim 10, wherein if the output voltage is close to the first voltage, then each of the determined respective column data values is a digital 0 value, and the determined respective column data values and the output voltage correspond to a NOR logic operation.

12. The method of claim 9, wherein the first word-lines are bottom-lines and the second word-lines are top-lines.

13. The method of claim 12, wherein if the output voltage is close to the first voltage, then each of the determined respective column data values is a digital 1 value, and the determined respective column data values and the output voltage correspond to an AND logic operation.

14. The method of claim 13, further comprising:
  inverting the output voltage by the sense amplifier, wherein the determined respective column data values and the inverted output voltage correspond to a NAND logic operation.

15. The method of claim 8, wherein each voltage-divider bit-cell comprises first and second transistors and first and second resistive memory devices, the method further comprising:
  for each activated voltage-divider bit cell:
    determining at least one of the first and second data resistances in the first and second resistive memory devices based on the second voltage and the electrical grounding to the first and second word-lines;
    determining an input voltage of the second transistor based on the stored first and second data resistances, wherein the second transistor is configured to provide a discharge path for the first voltage and is coupled to the column bit-line;
    determining if the input voltage of the second transistor exceeds a threshold voltage of the second transistor; and
    discharging the first voltage from the column bit-line to the resistive voltage-divider bit-cell if the input voltage exceeds the threshold voltage.

16. A method of performing a batch read in a memory array comprising:
  providing a first voltage to a column bit-line coupled to a plurality of rows of voltage-divider bit-cells;
  performing a first computation on two or more rows of the voltage-divider bit-cells in a first memory cycle, wherein the first computation is either a NOR-Boolean computation or a NAND-Boolean computation; and
  determining if first respective column data values of the two or more activated rows correspond to a first logic operation.

17. The method of claim 16, wherein the first logic operation is a NOR operation when the first computation is the NOR-Boolean computation, and wherein the first logic operation is a NAND operation when the first computation is the NAND-Boolean computation.

18. The method of claim 16, further comprising:
  performing a second computation on the two or more rows of the voltage-divider bit-cells in a second memory cycle if the first respective column data values do not correspond the first logic operation, wherein the first and second computations are different Boolean computations; and
  determining if second respective column data values of the two or more activated
rows correspond to a second logic operation, wherein
  the second computation is the NAND-Boolean computation when the first computation is the NOR-Boolean computation, and wherein the second computation is the NOR-Boolean computation when the first computation is the NAND-Boolean computation, and wherein
  the second logic operation is the NAND operation when the second computation is the NAND-Boolean computation, and the second logic operation is the NOR operation when the second computation is the NOR-Boolean computation.

19. The method of claim 18, further comprising:
  performing a sequential read operation in a third memory cycle if the second respective column data values do not correspond to the second logic operation, wherein the sequential read operation comprises:
  for each voltage-divider bit-cell:
    providing a first voltage to the column bit-line coupled to the second transistor of the voltage-divider bit-cell;
    providing a second voltage to a first word-line;
    providing an electrical grounding to a second word-line, wherein the first and second word-lines are coupled to the respective first and second storage elements devices;

determining at least one of first and second data resistances in the respective first and second storage elements based on an output voltage of the column bit-line; and determining the output voltage of the column bit-line.

20. The method of claim 16, wherein the NOR-Boolean computation is performed by:

activating the two or more rows of the voltage-divider bit-cells, wherein each of the two or more or rows are activated by:

providing a second voltage to respective top word-lines of the two or more rows and providing an electrical grounding to respective bottom word-lines of the two or more rows, wherein the respective top and bottom word-lines are coupled to the respective first and second resistive memory devices of the voltage-divider bit-cells; and determining the respective column data values of the two or more activated rows based on an output voltage of the column bit-line, wherein the NOR-Boolean computation determines if the respective column data values of the two or more activated rows are all a digital 0 value.

21. The method of claim 16, wherein the NAND-Boolean computation is performed by:

activating the two or more rows of the voltage-divider bit-cells, wherein each of the two or more or rows are activated by:

providing a second voltage to respective bottom word-lines of the two or more rows and providing an electrical grounding to respective top word-lines of the two or more rows, wherein the respective bottom and top word-lines are coupled to the respective first and second resistive memory devices of the voltage-divider bit-cells; and determining the respective column data values of the two or more activated rows based on an output voltage of the column bit-line, wherein the NAND-Boolean computation determines if the respective column data values of the two or more activated rows are all a digital 1 value.

* * * * *